(12) United States Patent
Muthukumar et al.

(10) Patent No.: US 11,217,516 B2
(45) Date of Patent: Jan. 4, 2022

(54) STACKED-CHIP PACKAGES IN PACKAGE-ON-PACKAGE APPARATUS, METHODS OF ASSEMBLING SAME, AND SYSTEMS CONTAINING SAME

(71) Applicant: INTEL CORPORATION, Santa Clara, CA (US)

(72) Inventors: Sriram Muthukumar, Chandler, AZ (US); Charles A. Gealer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/231,238

(22) Filed: Dec. 21, 2018

(65) Prior Publication Data

US 2019/0148275 A1    May 16, 2019

Related U.S. Application Data

(62) Division of application No. 13/741,382, filed on Jan. 14, 2013, now Pat. No. 10,186,480, which is a
(Continued)

(51) Int. Cl.
*H01L 23/498*   (2006.01)
*H01L 23/31*    (2006.01)
(Continued)

(52) U.S. Cl.
CPC .... *H01L 23/49816* (2013.01); *H01L 23/3121* (2013.01); *H01L 23/3128* (2013.01); *H01L 23/49822* (2013.01); *H01L 23/49827* (2013.01); *H01L 24/73* (2013.01); *H01L 25/0657* (2013.01); *H01L 25/105* (2013.01); *H01L 25/16* (2013.01); *H01L 25/18* (2013.01);
(Continued)

(58) Field of Classification Search
CPC ............. H01L 23/3121; H01L 23/3128; H01L 23/49816; H01L 23/49822; H01L 23/49827; H01L 23/49833; H01L 25/0657; H01L 24/73; H01L 25/105; H01L 25/16; H01L 25/18; H01L 25/50
USPC .......................... 257/686, 687, 723, 777, 778
See application file for complete search history.

(56) References Cited

U.S. PATENT DOCUMENTS 5,399,898 A    3/1995   Rostoker
6,157,080 A   12/2000   Tamaki et al.
(Continued)

FOREIGN PATENT DOCUMENTS

CN        1893053      1/2007
CN      101330076     12/2008
(Continued)

OTHER PUBLICATIONS

U.S. Pat. No. 7,786,591, dated Aug. 31, 2010, is cited as an English language equivalent of CN100501987, dated Jun. 17, 2009.
(Continued)

*Primary Examiner* — Matthew E Warren
(74) *Attorney, Agent, or Firm* — Essential Patents Group, LLP.

(57) ABSTRACT

A stacked-chip apparatus includes a package substrate and an interposer with a chip stack disposed with a standoff that matches the interposer. A package-on-package stacked-chip apparatus includes a top package disposed on the interposer.

14 Claims, 11 Drawing Sheets

Related U.S. Application Data division of application No. 12/459,226, filed on Jun. 26, 2009, now abandoned.

(51) Int. Cl.
*H01L 23/00* (2006.01)
*H01L 25/065* (2006.01)
*H01L 25/10* (2006.01)
*H01L 25/18* (2006.01)
*H01L 25/00* (2006.01)
*H01L 25/16* (2006.01)

(52) U.S. Cl.
CPC ........ *H01L 25/50* (2013.01); *H01L 23/49833* (2013.01); *H01L 24/16* (2013.01); *H01L 24/32* (2013.01); *H01L 24/33* (2013.01); *H01L 24/48* (2013.01); *H01L 2224/0401* (2013.01); *H01L 2224/05009* (2013.01); *H01L 2224/0557* (2013.01); *H01L 2224/13025* (2013.01); *H01L 2224/16* (2013.01); *H01L 2224/16225* (2013.01); *H01L 2224/16235* (2013.01); *H01L 2224/32145* (2013.01); *H01L 2224/32225* (2013.01); *H01L 2224/48091* (2013.01); *H01L 2224/48227* (2013.01); *H01L 2224/48228* (2013.01); *H01L 2224/73204* (2013.01); *H01L 2224/73253* (2013.01); *H01L 2224/73265* (2013.01); *H01L 2225/0651* (2013.01); *H01L 2225/06517* (2013.01); *H01L 2225/06541* (2013.01); *H01L 2225/1023* (2013.01); *H01L 2225/1041* (2013.01); *H01L 2225/1052* (2013.01); *H01L 2924/0002* (2013.01); *H01L 2924/00014* (2013.01); *H01L 2924/014* (2013.01); *H01L 2924/01005* (2013.01); *H01L 2924/01006* (2013.01); *H01L 2924/01023* (2013.01); *H01L 2924/01029* (2013.01); *H01L 2924/01033* (2013.01); *H01L 2924/01046* (2013.01); *H01L 2924/01047* (2013.01); *H01L 2924/01065* (2013.01); *H01L 2924/01068* (2013.01); *H01L 2924/01078* (2013.01); *H01L 2924/01079* (2013.01); *H01L 2924/14* (2013.01); *H01L 2924/15311* (2013.01); *H01L 2924/15331* (2013.01); *H01L 2924/181* (2013.01)

(56) References Cited

U.S. PATENT DOCUMENTS

| | | | |
|---|---|---|---|
| 6,353,263 | B1 | 3/2002 | Dotta et al. |
| 6,621,172 | B2 | 9/2003 | Nakayama et al. |
| 6,848,177 | B2 | 2/2005 | Swan et al. |
| 6,924,551 | B2 | 8/2005 | Rumer et al. |
| 7,429,786 | B2 | 9/2008 | Karnezos et al. |
| 7,446,420 | B1 | 11/2008 | Kim |
| 7,687,899 | B1 * | 3/2010 | Berry .................... H01L 21/561 257/687 |
| 7,786,591 | B2 | 8/2010 | Khan et al. |
| 7,829,990 | B1 * | 11/2010 | Scanlan ............. H01L 23/3107 257/686 |
| 7,841,080 | B2 | 11/2010 | Muthukumar et al. |
| 2001/0006828 | A1 | 7/2001 | McMahon |
| 2002/0004258 | A1 | 1/2002 | Nakayama et al. |
| 2002/0041027 | A1 | 4/2002 | Sugizaki |
| 2002/0074637 | A1 | 6/2002 | McFarland |
| 2002/0180025 | A1 | 12/2002 | Miyata et al. |
| 2004/0070083 | A1 | 4/2004 | Su |
| 2004/0084760 | A1 | 5/2004 | Chung-Lun et al. |
| 2004/0229400 | A1 | 11/2004 | Chua et al. |
| 2006/0102992 | A1 | 5/2006 | Kwon et al. |
| 2006/0175695 | A1 * | 8/2006 | Lee .......... H01L 23/13 257/686 |
| 2006/0267175 | A1 | 11/2006 | Lee |
| 2006/0273455 | A1 | 12/2006 | Williams et al. |
| 2006/0278970 | A1 | 12/2006 | Yano et al. |
| 2007/0007641 | A1 | 1/2007 | Lee et al. |
| 2007/0029106 | A1 | 2/2007 | Kato |
| 2007/0059918 | A1 | 3/2007 | Jung et al. |
| 2007/0138631 | A1 | 6/2007 | Cho |
| 2007/0181991 | A1 | 8/2007 | Ishino et al. |
| 2007/0187810 | A1 | 8/2007 | Mok et al. |
| 2007/0216001 | A1 | 9/2007 | Nakamura |
| 2008/0036082 | A1 * | 2/2008 | Eun ................... H01L 21/76898 257/737 |
| 2008/0111224 | A1 | 5/2008 | Byun et al. |
| 2008/0157326 | A1 | 7/2008 | Han et al. |
| 2008/0258286 | A1 * | 10/2008 | Gerber ................. H01L 25/105 257/686 |
| 2008/0277800 | A1 * | 11/2008 | Hwang ................. H01L 23/481 257/777 |
| 2008/0283992 | A1 | 11/2008 | Palaniappan et al. |
| 2008/0283993 | A1 | 11/2008 | Sanchez et al. |
| 2008/0284006 | A1 | 11/2008 | Hong et al. |
| 2008/0303163 | A1 | 12/2008 | Liu et al. |
| 2009/0166834 | A1 | 7/2009 | Yoon et al. |
| 2009/0321948 | A1 * | 12/2009 | Wang ..................... H01L 24/33 257/777 |
| 2010/0117215 | A1 * | 5/2010 | Lee ......................... H01L 24/12 257/691 |
| 2010/0327419 | A1 | 12/2010 | Muthukumar et al. |
| 2013/0127054 | A1 | 5/2013 | Muthukumar et al. |

FOREIGN PATENT DOCUMENTS

| | | |
|---|---|---|
| CN | 100501987 | 6/2009 |
| JP | 2004273706 | 9/2004 |
| JP | 2007123705 | 5/2005 |
| JP | 2005286010 | 10/2005 |
| JP | 2007123705 | 5/2007 |
| JP | 2007194444 | 8/2007 |
| JP | 2007234881 | 9/2007 |
| JP | 2008539599 | 11/2008 |
| TW | 290365 | 11/2007 |
| WO | 2006084177 | 8/2006 |
| WO | 2008082644 | 7/2008 |
| WO | 2010151375 | 12/2010 |

OTHER PUBLICATIONS

U.S. Pat. No. 7,446,420, dated Nov. 4, 2008, is cited as an English language equivalent of CN Publication No. 101330076, dated Dec. 24, 2008.
US Publication No. 2007/0007641, dated Jan. 11, 2007, is an English language equivalent of CN Publication No. 1893053, dated Jan. 10, 2007.
US Publication No. 2007/0181991, dated Aug. 9, 2007, is an English language equivalent of JP Publication No. 2007-194444, dated Aug. 2, 2007.
US Publication No. 2007/0216001, dated Sep. 20, 2007, is an English language equivalent of JP Publication No. 2007-234881, dated Sep. 13, 2007.
U.S. Pat. No. 7,429,786, dated Sep. 30, 2008, is cited as an English language equivalent of JP2008539599, dated Nov. 13, 2008.
US Publication No. 2004/0070083, dated Apr. 15, 2004, is an English language equivalent of TW Publication No. 290365, dated Nov. 21, 2007.
Office Action 1 for for U.S. Appl. No. 13/741,382 (parent to U.S. Appl. No. 13/741,382), dated Oct. 26, 2011.
Response to Office Action 1 for for U.S. Appl. No. 13/741,382 (parent to U.S. Appl. No. 13/741,382), dated Apr. 26, 2012.
Response to Notice of Non-Compliant Amendment for for U.S. Appl. No. 13/741,382 (parent to U.S. Appl. No. 13/741,382), dated Jun. 8, 2012.
Office Action 2 for U.S. Appl. No. 13/741,382 (parent to U.S. Appl. No. 13/741,382), dated Sep. 13, 2012.

(56) References Cited

OTHER PUBLICATIONS

International Search Report and Written Opinion for International Application No. PCT/US2010/033536, dated Nov. 22, 2010, 11 pp. [77.262PCT (ISR & WO)].
Office Action 1 for CN Application No. 201080028740.6, dated Aug. 27, 2014, 24 pp. [with English Translation] [77.262CN (OA1)].
Response to Office Action 1 for CN Application No. 201080028740.6, dated Jan. 9, 2015, 20 pp. (w/ English Claims) [77 262CN (ROA1)].
Office Action 2 for CN Application No. 201080028740.6, dated Mar. 23, 2015, 20 pp. [w/ English Language Translation].
Response to Office Action 2 for CN Application No. 201080028740.6, dated Jun. 8, 2015, 17 pp. (w/ English Claims) [77.262CN (ROA2)].
Office Action 3 for CN Application No. 201080028740.6, dated Aug. 12, 2015, 12 pp. (w/ English Translation) [77.262CN (OA3)].
Response to Office Action 3 for CN Application No. 201080028740.6, dated Oct. 27, 2015, 16 pp. (w/ English Claims) [77.262CN (ROA3)].
Office Action 1 for DE Application No. 112010002692.0, dated Apr. 10, 2018, 19 pp. (w/ English language Machine Translation) [77.262DE (OA1)].
Office Action 1 for GB Application No. 1119498.2, dated Jul. 15, 2013, 3 pp. [77.262GB (OA1)].
Response to Office Action 1 for GB Application No. 1119498.2, dated May 28, 2013, 17 pp. [77.262GB (ROA1)].
Office Action 2 for GB Application No. 1119498.2, dated Sep. 25, 2013, 3 pp. [77.262GB (OA2)].
Response to Office Action 2 for GB Application No. 1119498.2, dated Jan. 27, 2014, 13 pp. [77.262GB (ROA2)].
Office Action 3 for GB Application No. 1119498.2, dated Feb. 3, 2014, 3 pp. [77.262GB (OA3)].
Response to Office Action 3 for GB Application No. 1119498.2, dated May 6, 2014, 10 pp. [77.262GB (ROA3)].
Response to Office Action 4 for GB Application No. 1119498.2, dated May 9, 2014, 38 pp. [77.262GB (ROA4)].
Office Action 1 for JP Application No. 2012-517527, dated May 28, 2013, 9 pp. [77.262JP (OA1)].
Response to Office Action 1 for JP Application No. 2012-517527, dated Aug. 26, 2013, 11 pp. (w/ English Version of the Pending Claims) [77.262JP (ROA1)].
Final Office Action 1 for JP Application No. 2012-517527, dated Apr. 22, 2014, 6 pp. (w/ English Translation) [77.262JP (FOA1)].
Office Action 1 for IN Application No. 9215/DELNP/2011, dated Aug. 2, 2017, 5 pp. [77.262IN (OA1)].
Office Action 1 for KR Application No. 2011-7030885, dated May 1, 2013, 3 pp. [77.262KR (OA1)].
Response to Office Action 1 for KR Application No. 2011-7030885, dated Aug. 1, 2013, 41 pp. (w/ English Version of the Pending Claims) [77.262KR (ROA1)].
Notice of Allowance 1 for KR Application No. 2011-7030885, dated Dec. 13, 2013, 3 pp. [77.262KR (NOA1)].
Office Action 1 for RU Application No. 2011153251, dated Mar. 27, 2012, 4 pp. [77.262RU (OA1)].
Response to Office Action 1 for RU Application No. 2011153251, dated May 24, 2012, 7 pp. [77.262RU (ROA1)].
Office Action and Search Report for TW Application No. 099114527, dated Feb. 14, 2014, 17 pp. (with Engl Translation of Notice) [77.262TW (OA1 & SR)].
Response to Office Action 1 for TW Application No. 099114527, dated May 15, 2014, 8 pp. (w/ English Claims) [77.262TW (ROA1)].
Notice of Allowance 1 for TW Application No. 099114527, dated Feb. 5, 2015, 5 pp. (w/ English Claims) [77.262TW (NOA1)].
Office Action 1 and Search Report for TW Application No. 104107205, dated Sep. 17, 2015, 19 pp. (w/ English Translation) [77.262TWD1 (OA1 & SR)].
Final Office Action for TW Application No. 104107205, dated Feb. 25, 2016, 18 pp. (w/ English Translation) [77.262D1 (FOA1)].
Restriction Requirement for U.S. Appl. No. 13/741,382, dated Jul. 5, 2013, 9 pp. [77.262D1 (RestReq)].
Response to Restriction Requirement for U.S. Appl. No. 13/741,382, dated Aug. 5, 2013, 2 pp. [77.262D1 RespRestReq)].
Office Action 1 for U.S. Appl. No. 13/741,382, dated Sep. 5, 2013, 21 pp. [77.262D1 (OA1)].
Response to Office Action 1 for U.S. Appl. No. 13/741,382, dated Dec. 5, 2013, 9 pp. [77.262D1 (ROA1)].
Supplemental Response to Office Action 1 for U.S. Appl. No. 13/741,382, dated Feb. 11, 2014, 8 pp. [77.262D1 (SuppROA1)].
Final Office Action 1 for U.S. Appl. No. 13/741,382, dated Mar. 11, 2014, 28 pp. [77.262D1 (FOA1)].
Pre-Appeal Brief 1 for U.S. Appl. No. 13/741,382, dated Sep. 11, 2014, 6 pp. [77.262D1 (Pre-ApplBrf1)].
Office Action 3 for U.S. Appl. No. 13/741,382, dated Jun. 24, 2015, 30 pp. [77.262D1 (OA3)].
Response to Office Action 3 for U.S. Appl. No. 13/741,382, dated Sep. 24, 2015, 11 pp. [77.262D1 (ROA3)].
Office Action 4 for U.S. Appl. No. 13/741,382, dated Dec. 18, 2015, 30 pp. [77.262D1 (OA4)].
Response to Office Action 4 for U.S. Appl. No. 13/741,382, dated Mar. 18, 2016, 11 pp. [77.26201 (ROA4)].
Final Office Action 2 for U.S. Appl. No. 13/741,382, dated Aug. 23, 2016, 26 pp. [77.262D1 (FOA2)].
Pre-Appeal Brief Request for U.S. Appl. No. 13/741,382, dated Oct. 24, 2016, 6 pp. [77.262D1 (Pre-ApplnBrf2)].
Office Action 6 for U.S. Appl. No. 13/741,382, dated Oct. 4, 2017, 23 pp. [77.262D1 (OA6)].
Response to Office Action 6 for U.S. Appl. No. 13/741,382, dated Jan. 4, 2018, 10 pp. [77.26201 (ROA6)].
Final Office Action 3 for U.S. Appl. No. 13/741,382, dated May 10, 2018, 30 pp. [77.262D1 (FOA3)].
Response to Final Office Action 3 for U.S. Appl. No. 13/741,382, dated Jul. 10, 2018, 11 pp. [77.26201 (RFOA3)].
Notice of Allowance 1 for U.S. Appl. No. 13/741,382, dated Sep. 11, 2018, 32 pp. [77.262D1 (NOA1)].
Office Action and Search Report for BR Application No. P11009636-1, dated Aug. 7, 2019, 9 pp. (w/ Machine Translation) [77.262BR (OA)].
Response to Office Action for BR Application No. PI1009636-1, dated Nov. 8, 2019, 50 pp. (w/ Machine Translation) [77.262BR (ROA)].
Response for DE Application No. 112010002692, dated Sep. 23, 2019, 633 pp. (w/ Machine Translation) [77.262DE (ROA)].
Minutes of Hearing for DE Application No. 112010002692, dated May 22, 2019, 45 pp. (w/ Machine Translation) [77.262DE (Minutes)].
Notice of Allowance for German Patent Application No. 112010002692.0, dated May 6, 2021; no translation available.

* cited by examiner

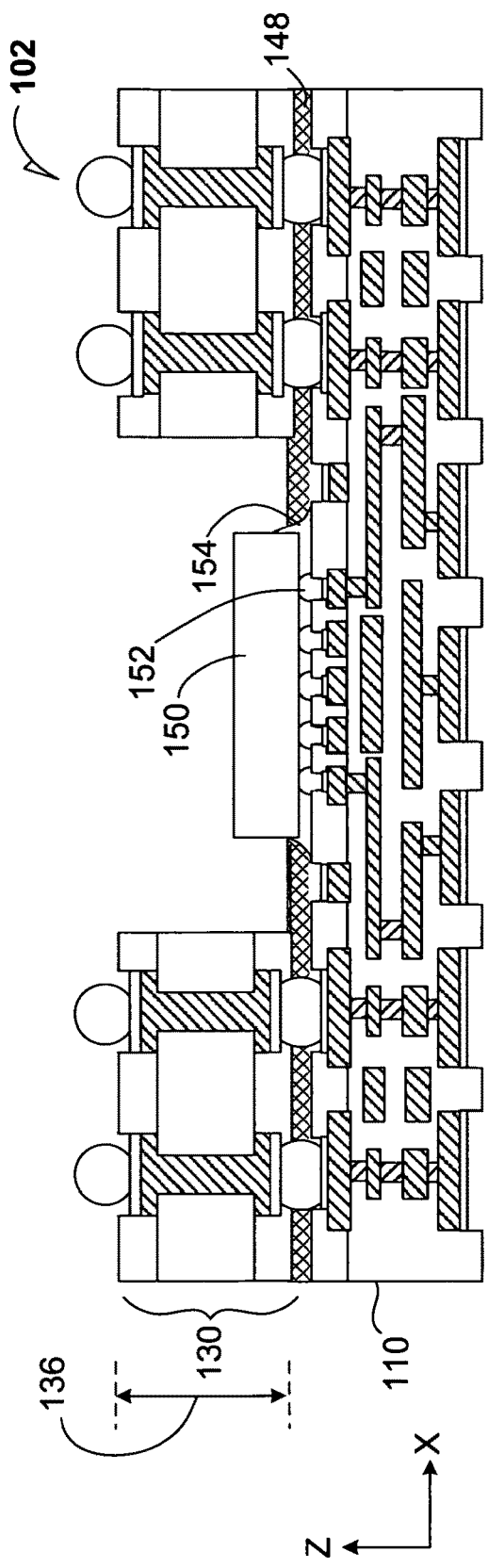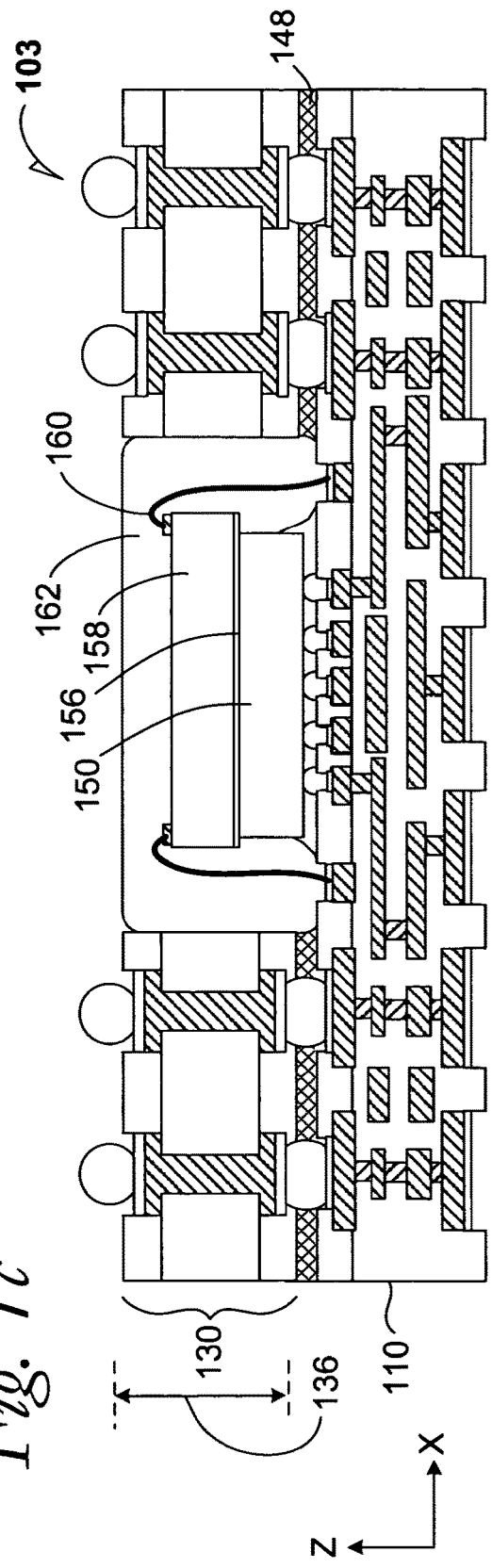

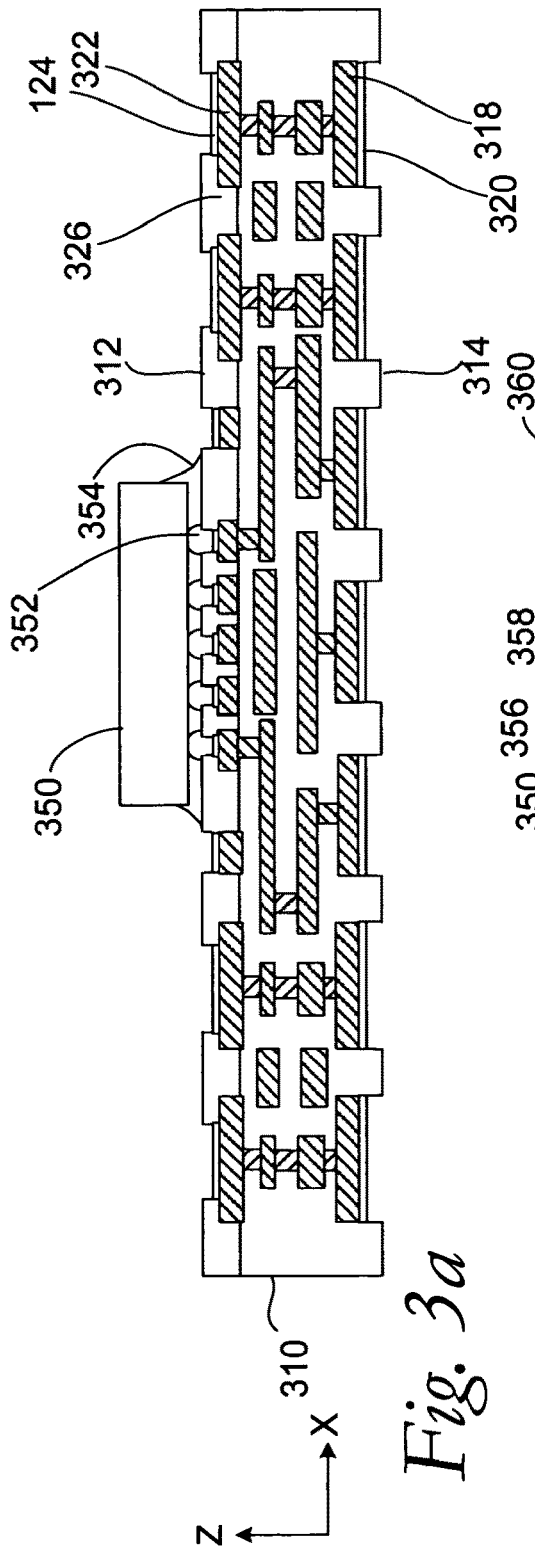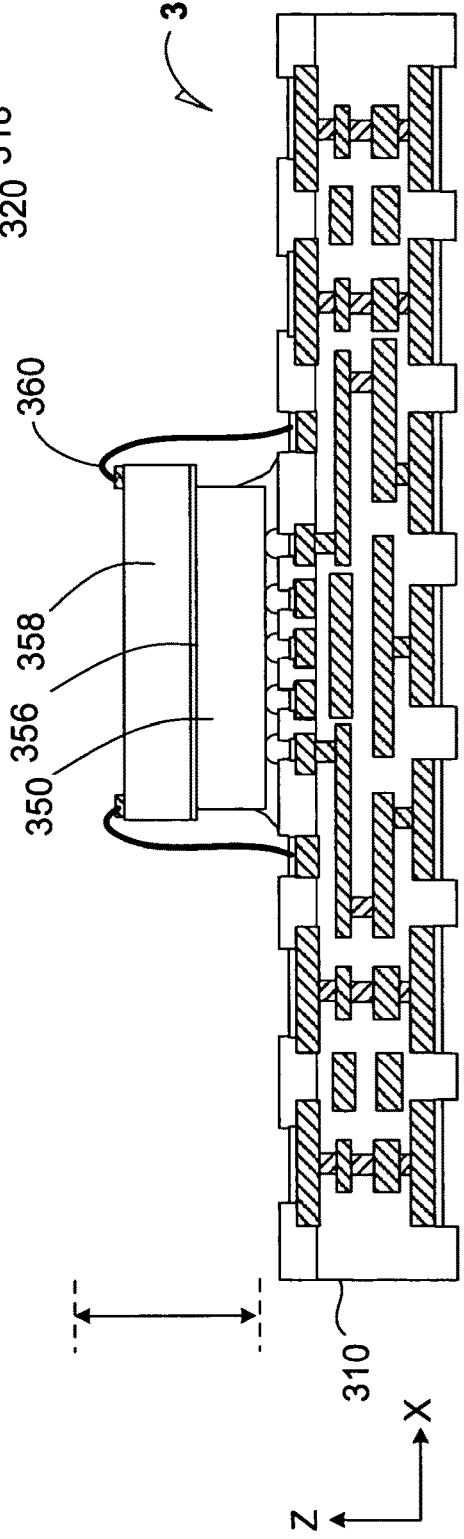

STACKED-CHIP PACKAGES IN PACKAGE-ON-PACKAGE APPARATUS, METHODS OF ASSEMBLING SAME, AND SYSTEMS CONTAINING SAME

TECHNICAL FIELD

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1c is a cross-section elevation of the apparatus depicted in FIG. 1b after further processing according to an embodiment;

FIG. 1d is a cross-section elevation of the apparatus depicted in FIG. 1c after further processing according to an embodiment;

FIG. 3a is a cross-section elevation of a mixed-die apparatus during processing according to an example embodiment;

FIG. 3b is a cross-section elevation of the apparatus depicted in FIG. 3a after further processing according to an embodiment;

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with which the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" may be understood by reference to the X-Z or Y-Z coordinates, and terms such as "adjacent" may be understood by reference to the illustrated X-Y coordinates.

Figure 1A:
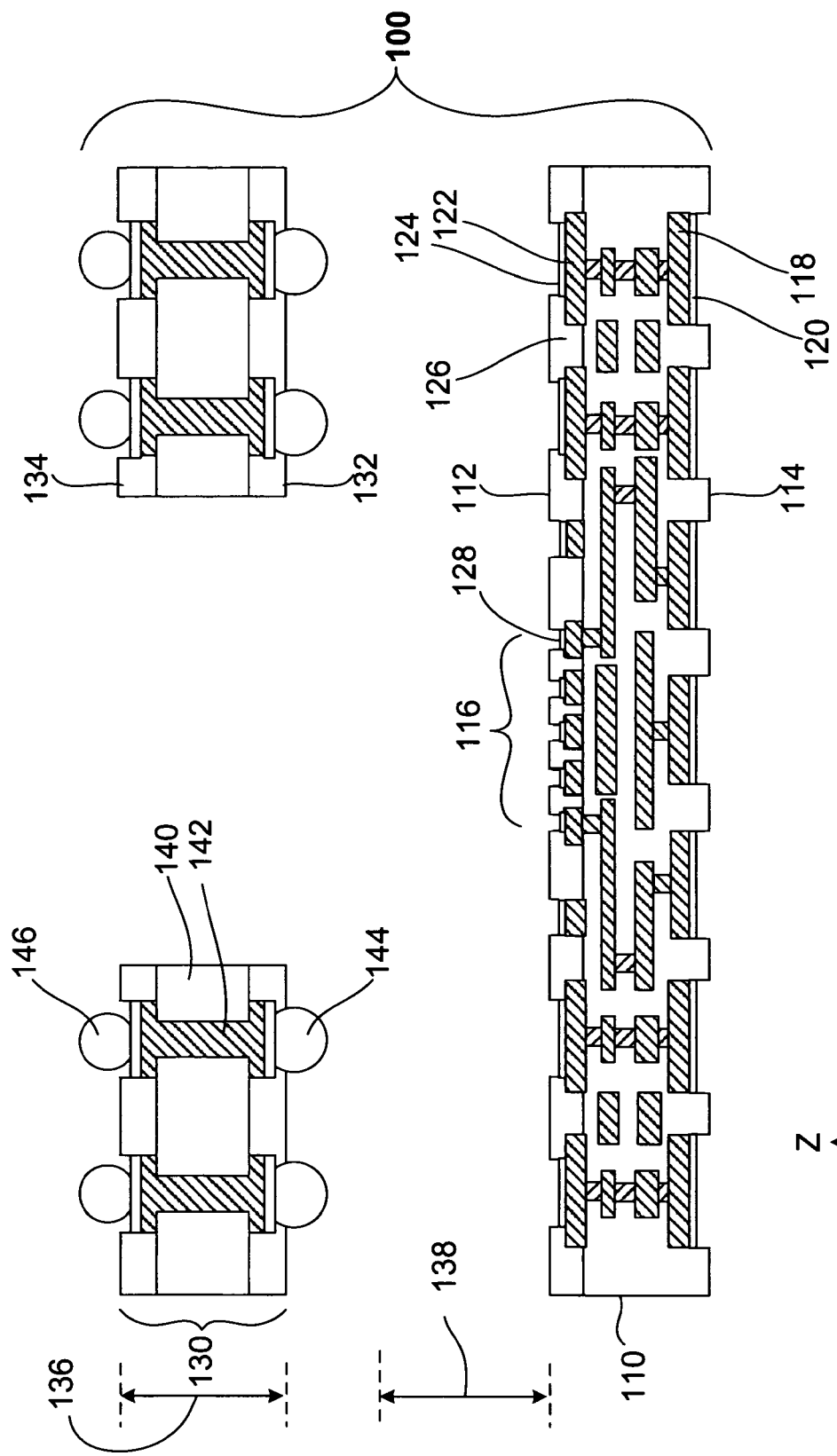
FIG. 1a is a cross-section elevation of a mounting substrate and interposer apparatus for a stacked-die package according to an example embodiment.

FIG. 1a is a cross-section elevation of a mounting substrate and interposer apparatus 100 for a stacked-chip package according to an example embodiment. The apparatus 100 is depicted vertically (Z-direction) in exploded view including a package substrate 110 and an interposer 130. The package substrate 110 includes a die side 112 to accept a processor, and a land side 114 for coupling to outside communication such as a board. The "board" may be an external- or near-external structure for a hand-held device such as a wireless communicator. The package substrate 110 includes a bottom-chip footprint 116 on the die side 112. The bottom-chip footprint 116 may be ascertained in subsequent drawings disclosed herein by projecting illustrated processors on respective die sides of illustrated mounting substrates.

The package substrate 110 includes a land-side ball-grid array, one ball pad of which is indicated with reference numeral 118. In an embodiment, the ball pad 118 includes a surface finish 120. The surface finish 120 is configured to be a less electronegative metal than the ball pad 118. The surface finish 120 is formed by electroplating according to an embodiment. Alternatively, the surface finish 120 is formed by electroless plating.

In an example embodiment, the ball pad 118 is copper and the surface finish 120 is a nickel-palladium-gold alloy plated onto the copper. In an embodiment, the surface finish 120 is a nickel-gold alloy plated onto the copper. In an embodiment, the surface finish 120 is copper-gold plated onto the copper.

In an example embodiment, the ball pad 118 is copper and the surface finish 120 is an organic solderability preservative (OSP) composition such as aryl-phenylimidazole. In an example embodiment, the surface finish 120 has a thickness from 1,000 Å to 2,000 Å and is aryl-phenylimidazole.

Similarly, the package substrate 110 includes a die-side ball-grid array, one ball pad of which is indicated with reference numeral 122 and the ball pad 122 includes a surface finish 124. The ball pad 122 and surface finish 124 may be an embodiment similar to those found on the board side 114. In an embodiment, the die-side ball-grid array 122 is defined by a solder resist 126. Similarly, the solder resist 126 may define die-bump pads found within the bottom chip footprint 116, and one of which is indicated with reference numeral 128. The package substrate 110 is depicted between the die side 112 and the land side 114 with interconnect and interlayer dielectric structures that are illustrative but not limiting.

The apparatus 100 is assembled with the interposer 130 that mates to the die-side ball grid array 122. The interposer 130 includes a die side 132 and a top side 134 and has an offset height 136 configured to match an offset height 138 above the package substrate 110 for a multiple die stack (MDS) that will occupy the bottom-chip footprint 116. The interposer 130 may include a core 140 and interconnects 142. In an embodiment, die-side electrical bumps 144 and top-side electrical bumps 146 are coupled to the interconnects 142.

Figure 1B:
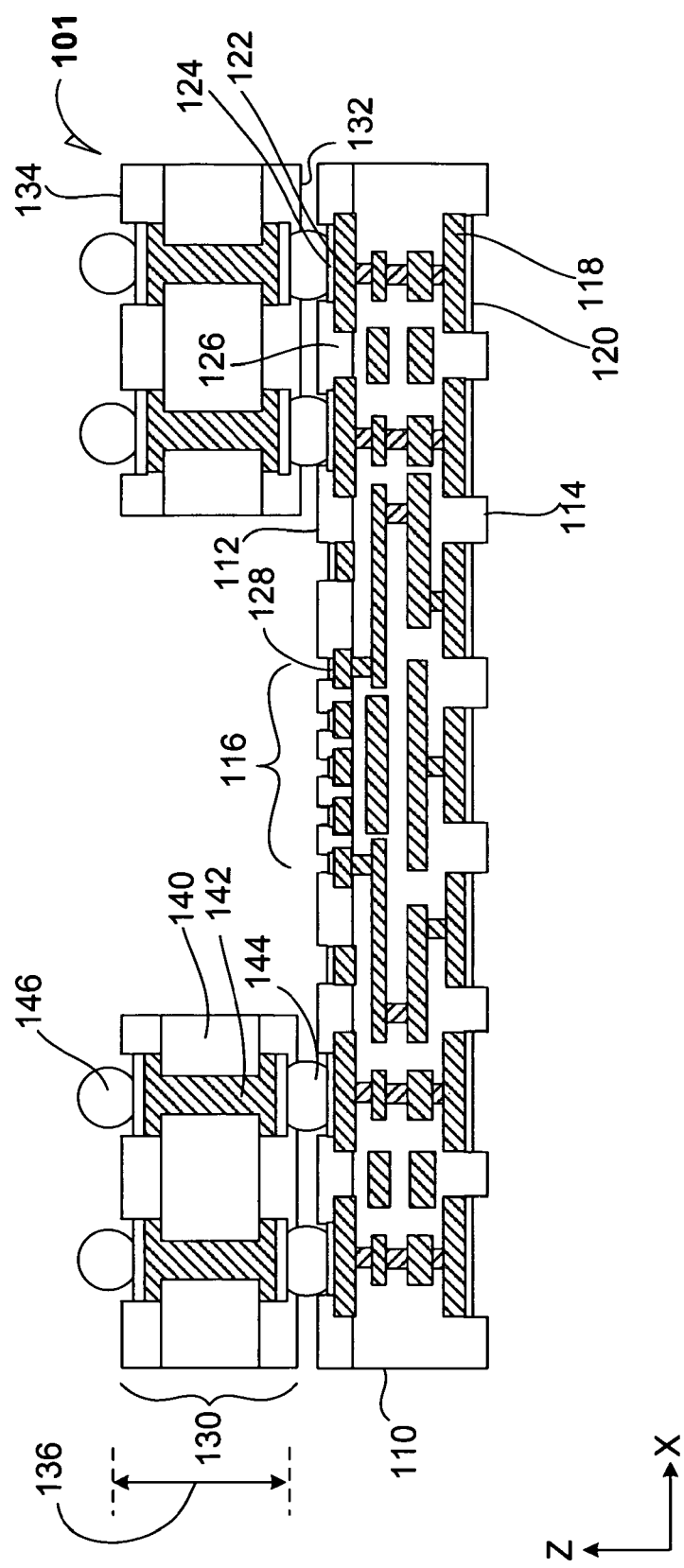
FIG. 1b is a cross-section elevation of the apparatus depicted in FIG. 1a after further processing according to an embodiment.

FIG. 1b is a cross-section elevation of the apparatus depicted in FIG. 1a after further processing according to an embodiment. The apparatus 101 illustrates that the interposer offset height 136 matches the package-substrate offset height 138 (FIG. 1a). The bottom-chip footprint 116 is surrounded by the interposer 130 and will surround the multiple-die stack that is to be assembled as part of the apparatus 101.

FIG. 1c is a cross-section elevation of the apparatus depicted in FIG. 1b after further processing according to an embodiment. The apparatus 102 has been fortified with an interposer fill material 148 that stabilizes bonding between the package substrate 110 and the interposer 130.

A bottom chip 150 is placed within the bottom-chip footprint 116 (FIG. 1b). In an embodiment, the bottom chip 150 is a flip chip 150 that has been flip-chip bonded though a chip ball array, one electrical bump of which is referenced with numeral 152. In an embodiment, an underfill 154 has been flowed to fortify bonding between the bottom chip 150 and the package substrate 110. In a processing embodiment, reflow of the electrical bumps 152 is carried our during simultaneous curing of the underfill 154. In a processing embodiment, reflow of the electrical bumps 152 is carried our during simultaneous curing of the fill material 148.

In an embodiment, the bottom chip 150 is processed to reflow the electrical bumps 152, followed by placement of the underfill 154 after bump reflow.

FIG. 1d is a cross-section elevation of the apparatus depicted in FIG. 1c after further processing according to an embodiment. The apparatus 102 depicted in FIG. 1c has been further processed to achieve a mixed-die apparatus 103 that will become part of a package-on-package (PoP) stacked chip apparatus. The mixed-die apparatus 103 includes an inter-die adhesive 156 that has been formed on the bottom chip 150, and a top chip 158 has been mounted on the adhesive 156. The top chip 158 is supported by the bottom chip 150. Hereinafter, a chip stack that originates with a bottom chip (e.g. chip 150) disposed on the package substrate 110 and that terminates with a subsequent chip (e.g. chip 158) may also be referred to as a 3-dimensional (3D) chip stack.

In an embodiment, the top chip 158 is coupled to the package substrate 110 by wire bonds, one of which is indicated by reference numeral 160. Consequently, the mixed-stack apparatus 103 includes a flip chip 150 mounted on the package substrate 110 and a wire-bond chip 158 disposed above the flip chip 150. The offset height 136 of the interposer 130 therefore accommodates the height of the mixed-stack that includes the wire bonds 160 as well as the top chip 158 the adhesive 156, the bottom chip 150, and the offset created by the electrical bumps 152 (seen in FIG. 1c).

In a process embodiment, a stack encapsulation 162 has been filled to isolate the mixed-die stack and to further prevent the bond wires 160 from moving. The stack encapsulation 162 may be used also to protect the mixed-die stack from environmental and handling dangers. The stack encapsulation 162 may also be used to facilitate heat transfer away from the mixed-die stack. In an embodiment, no stack encapsulation is used.

In an embodiment, the bottom chip 150 is a processor and the top chip 158 is a radio-frequency (RF) device. The mixed-die stack may be used in a wireless communicator (e.g. a cellular telephone) such as a smart phone.

Figure 1E:
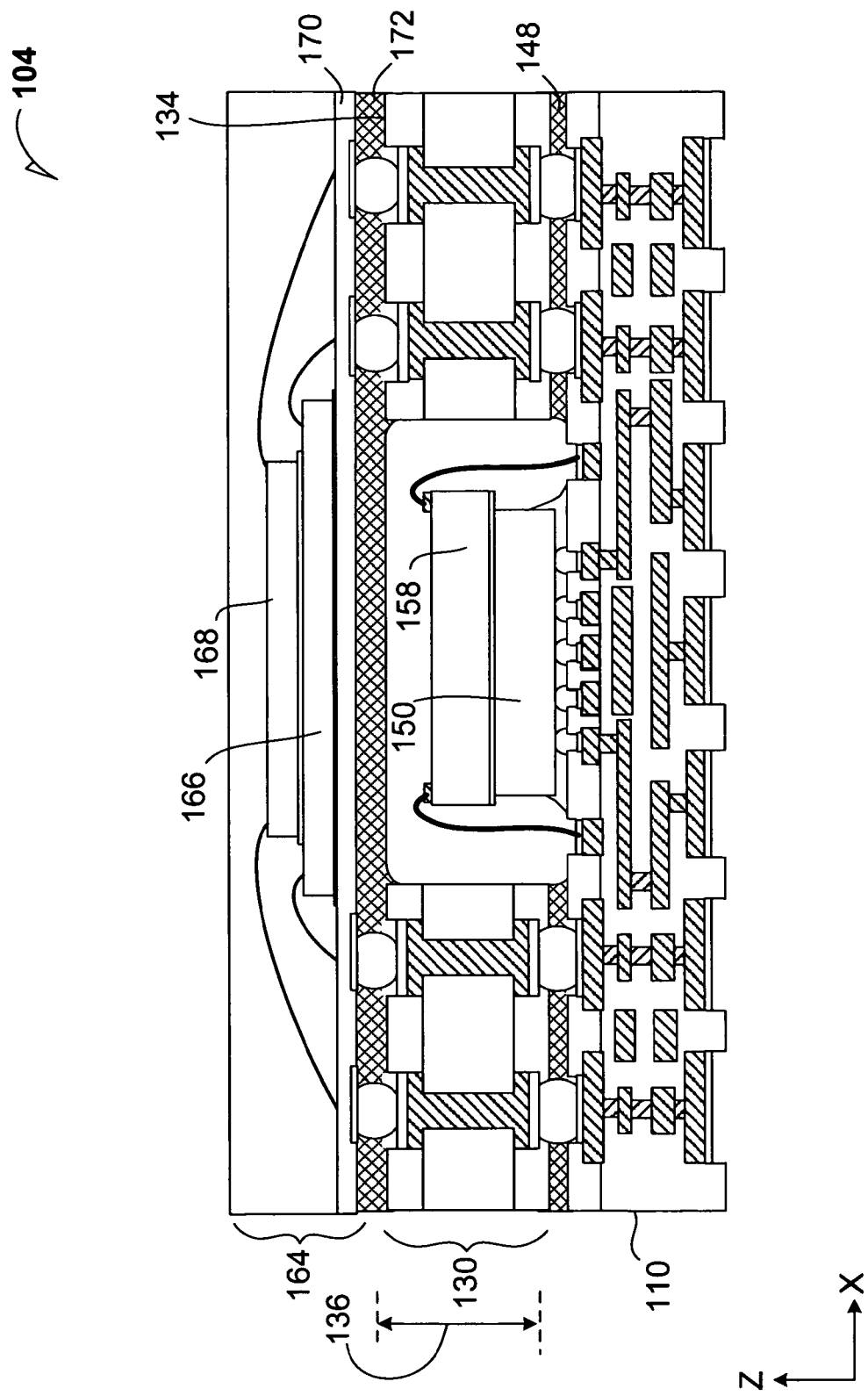
FIG. 1e is a cross-section elevation of a package-on-package stacked chip apparatus that has been assembled with the apparatus depicted in FIG. 1d after further processing according to an example embodiment.

FIG. 1e is a cross-section elevation of a package-on-package (PoP) stacked chip apparatus 104 that has assembled with the apparatus depicted in FIG. 1d after further processing according to an example embodiment. The bottom chip 150 and the top chip 158 are set within the interposer offset 136 and a top package 164 has been mated to the top side 134 of the interposer 130. The top package 164 may have a mounting substrate 170 for communication to the bottom chip 150 and/or the top chip 158. The top package 164 is depicted as a wire-bond enabling solution such as for an original-equipment manufacturer. Two wire-bonded dice are depicted in the top package 164. A die located in the top package 164 may be referred to as a microelectronic device. In an embodiment, the mixed-stack apparatus 103 depicted in FIG. 1d is provided to accommodate a top package 164 such as for a smart phone, where smart-phone specific microelectronic devices are in the top package 164 and support microelectronic devices are in the chip stack.

In an embodiment, a top-package fill material 172 stabilizes bonding between the interposer 130 and the top package 164.

It can be seen that the mixed stack of the bottom chip 150 and top chip 158 have been accommodated by the interposer offset 136 such that the top package 164 does not interfere with the mixed stack. Consequently, the PoP stacked-chip apparatus is assembled with sufficient interposer offset 136 to accommodate an offset height of the chip stack that may vary depending upon a specific application.

Figure 2A:
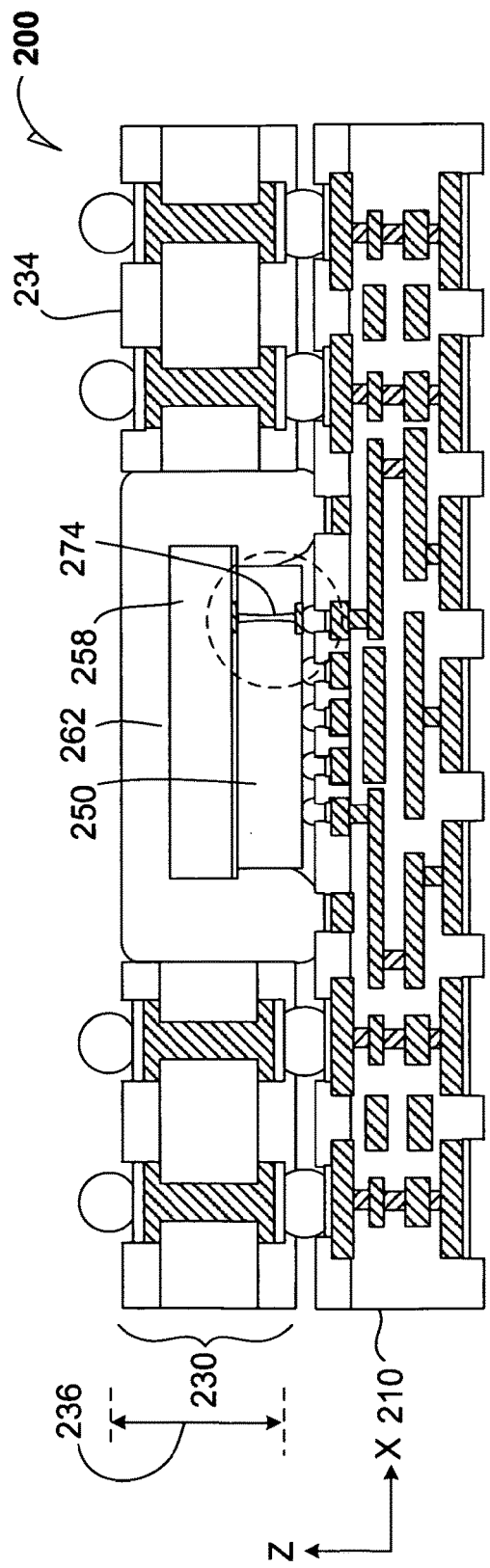
FIG. 2a is a cross-section elevation of a mounting substrate and interposer apparatus for a stacked-die package according to an example embodiment.

FIG. 2a is a cross-section elevation of a mounting substrate and interposer apparatus 200 for a stacked-die package according to an example embodiment. The apparatus 200 is similar to the apparatus 103 depicted in FIG. 1d and has been processed similarly by seating an interposer 230 upon a package substrate 210.

A stacked-chip apparatus 200 is depicted. The stacked-chip apparatus 200 includes a bottom chip 250 and a top chip 258. In an embodiment, the bottom chip 250 is a processor and the top chip 258 is a memory die that is coupled by through-silicon via (TSV) technology. A single TSV 274 is detailed within the dashed circle. In an embodiment, the top chip 258 is a level-2 (L2) memory cache (where L0 and L1 are within the processor 250) such as a static random-access memory (SRAM) for the processor 250. The bottom chip 250 and the top chip 258 are a 3D Consequently, the stacked-chip apparatus 200 includes the flip chip 250 mounted on the package substrate 210 and the TSV-coupled chip 258 disposed above the flip chip 250. The offset height 236 of the interposer 230 therefore accommodates the height of the stacked-chip configuration. Processing of the bottom chip 250 may be done by any embodiment disclosed with respect to the bottom chip 150 depicted in FIG. 1c and elsewhere.

In an embodiment, the top chip 258 is a memory die such as a random-access memory (RAM) die 258. In an embodiment, the top chip 258 is a memory die such as a dynamic random-access memory (DRAM) die 258. In an embodiment, the top chip 258 is a memory die such as a static random-access memory (SRAM) die 258. In an embodiment, the top chip 258 is a memory die such as a erasable programmable memory (EPROM) die 258. Other memory die configurations may be used according to a specific application.

In an embodiment, the top chip 258 includes a radio-frequency device (RF) tag. In an embodiment, the top chip 258 includes a radio-frequency device for wireless communication.

In a process embodiment, a stack encapsulation 262 has been filled to isolate the chip stack. The stack encapsulation 262 may be used also to protect the chip stack from environmental and handling dangers. The stack encapsulation 262 may also be used to facilitate heat transfer away from the chip stack. In an embodiment, no stack encapsulation is used.

Figure 2B:
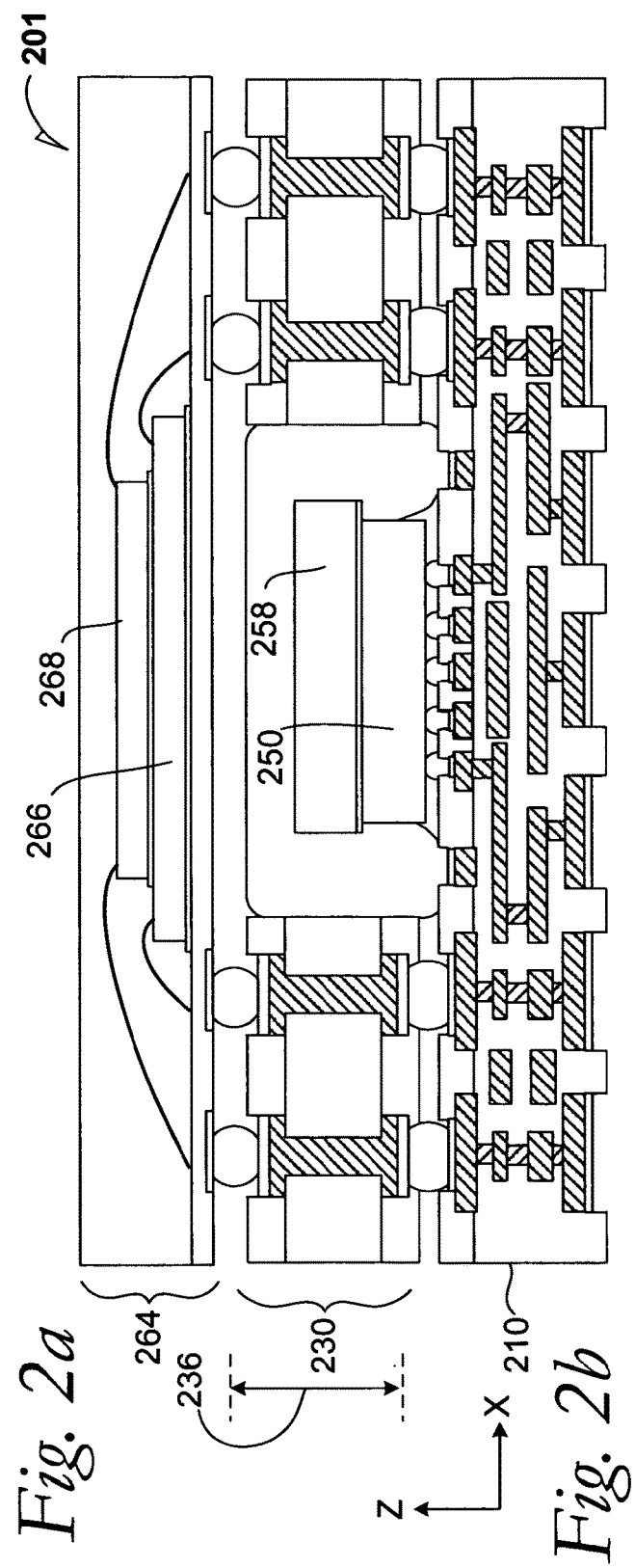
FIG. 2b is a cross-section elevation of a package-on-package stacked-chip apparatus that has assembled from the apparatus depicted in FIG. 2a after further processing according to an example embodiment.

FIG. 2b is a cross-section elevation of a PoP stacked-chip apparatus 201 that has assembled from the apparatus depicted in FIG. 2a after further processing according to an example embodiment. The bottom chip 250 and the top chip 258 are set within the interposer offset 236 and a top package 264 has been mated to the top side 234 of the interposer 230. The top package 264 may have a mounting substrate 270 for communication to the bottom chip 250 and/or the top chip 258. The top package is depicted as TSV enabling solution such as for an original-equipment manufacturer. In an embodiment, the chip stack apparatus 200 depicted in FIG. 2a is provided to accommodate a top package 264 such as for a smart phone.

It can be seen that the chip stack of the bottom chip 250 and top chip 258 have been accommodated by the interposer offset 236 such that the top package 264 does not interfere with the chip stack.

Details illustrated and described with respect to FIG. 1e may also be inferred by observing similar structures and spaces depicted in FIG. 2b where appropriate.

It can now be understood that processing to achieve the PoP stacked-chip apparatus 201 may be similar to processing to achieve the PoP stacked-chip apparatus 104 depicted in FIG. 1e.

In an example embodiment, I/O density between the bottom chip 150 and the top chip 158 is in a range between 128 bits per die (such as when the top chip 258 is a DRAM die) and 252 bits/die. In an example embodiment, I/O speed between the processor 250 and the subsequent chip 258 is between 10 Gb/s and 1 Tb/s (tera bits per second). Along a 10 mm edge section of the subsequent chip 250 as a DRAM device, total bandwidth is from 160 GB/s to 320 GB/s. As a package, the PoP apparatus 201 has a total package bandwidth between 640 GB/s to 6400 GB/s according to an embodiment, where the processor 250 and the subsequent chip 258 each may operate at or above 256 bits. The I/O speed may run slower below 10 Gb/s (such as below 7 Gb/s) where a given application may be useful at this range.

FIG. 3a is a cross-section elevation of a mixed-die apparatus 300 during processing according to an example embodiment. A bottom chip 350 is placed on a package substrate 310 that may be similar to the package substrate 110 depicted in FIG. 1c. In an embodiment, the bottom chip 350 is a flip chip 350 that has been flip-chip bonded though a chip ball array, one electrical bump of which is referenced with numeral 352. In an embodiment, an underfill 354 has been flowed to fortify bonding between the bottom chip 350 and the package substrate 310. In a processing embodiment, reflow of the electrical bumps 352 is carried our during simultaneous curing of the underfill 354.

Processing of the bottom chip 350 may be done by any embodiment disclosed with respect to the bottom chips 150, 250, and elsewhere depicted in this disclosure.

FIG. 3b is a cross-section elevation of the apparatus depicted in FIG. 3a after further processing according to an embodiment. The apparatus 301 depicted in FIG. 3b has been further processed to achieve a mixed-stack apparatus 301 that will be part of a PoP stacked-chip apparatus. The mixed-stack apparatus 301 includes an inter-die adhesive 356 that has been formed on the bottom chip 350, and a top chip 358 has been mounted on the adhesive 356. The top chip 358 is supported by the bottom chip 350.

In an embodiment, the top chip 358 is coupled to the package substrate 310 by wire bonds, one of which is indicated by reference numeral 360. Consequently, the mixed-stack apparatus 301 includes a flip chip 350 mounted on the package substrate 310 and a wire-bond chip 358 disposed above the flip chip 350. An offset height 336 will be matched by the offset height of an interposer in further processing. It will now be clear that assembly of the mixed-stack precedes assembly of an interposer to the package substrate 310.

Similar to the mixed-die stack apparatus embodiment depicted in FIG. 1d, the interposer to be assembled will accommodate the height of the mixed-die stack that includes the wire bonds 360 as well as the top chip 358 the adhesive 356, the bottom chip 350 and the offset created by the electrical bumps 352. In an embodiment, no stack encapsulation is used.

In an embodiment, the bottom chip 350 is a processor and the top chip 358 is a RF device. The mixed-die stack may be used in a wireless communicator such as a smart phone. Details illustrated and described with respect to previously disclosed embodiments may also be inferred by observing similar structures and spaces depicted in FIG. 3b where appropriate. Additionally, previously disclosed I/O- and bandwidth capabilities may be inferred with respect to the PoP stacked-chip embodiments depicted and described in FIG. 3b.

Figure 4:
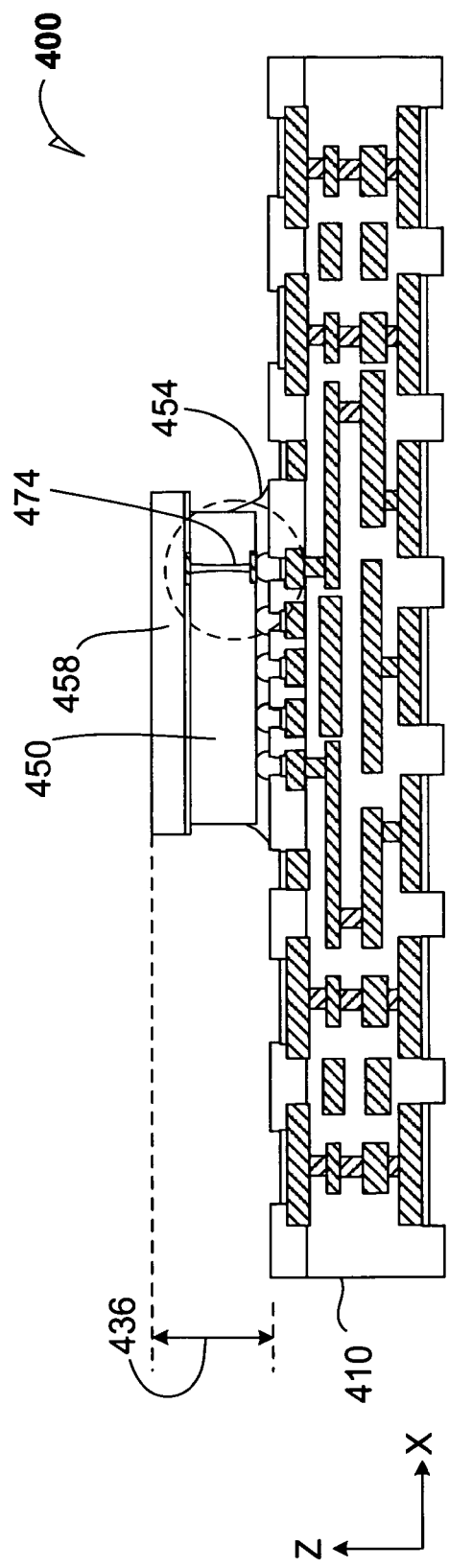
FIG. 4 is a cross-section elevation of a mounting substrate and interposer apparatus for a stacked-die package according to an example embodiment.

FIG. 4 is a cross-section elevation of a mounting substrate and interposer apparatus 400 for a stacked-die package according to an example embodiment. The apparatus 400 is similar to the apparatus 200 depicted in FIG. 2a except assembly of an interposer is carried out after assembly of the stacked dice 450 and 458.

A stacked-chip apparatus 400 is depicted. The stacked-chip apparatus 400 includes a bottom chip 450 and a top chip 458. In an embodiment, the bottom chip 450 is a processor and the top chip 458 is a memory die that is coupled by through-silicon via (TSV) technology. A single TSV 474 is detailed within the dashed circle. In an embodiment, the top chip 558 is a level-2 (L2) memory cache (where L0 and L1 are within the processor 450) such as a static random-access memory (SRAM) for the processor 450. Processing of the bottom chip 450 may be done by any embodiment disclosed with respect to the bottom chips 150, 250, 350, and elsewhere depicted in this disclosure.

Consequently, the stacked-chip apparatus 400 includes the flip chip 450 mounted on the package substrate 410 and the TSV-coupled chip 458 disposed above the flip chip 450. The offset height 436 of the stacked chips 450 and 458 will be matched by an interposer that will be assembled. The interposer will therefore accommodate the height of the stacked-chip configuration.

In an embodiment, the top chip 458 is a memory die such as a random-access memory (RAM) die 458. In an embodiment, the top chip 458 is a memory die such as a dynamic random-access memory (DRAM) die 458. In an embodiment, the top chip 458 is a memory die such as a static random-access memory (SRAM) die 458. In an embodiment, the top chip 458 is a memory die such as a erasable programmable memory (EPROM) die 458. Other memory die configurations may be used according to a specific application.

In an embodiment, the top chip 458 includes a radio-frequency device (RF) tag. In an embodiment, the top chip 458 includes a radio-frequency device for wireless communication. In a process embodiment, a stack encapsulation will be filled into the recess the interposer will form around the chip stack.

Details illustrated and described with respect to previously disclosed embodiments may also be inferred by observing similar structures and spaces depicted in 4 where appropriate. Additionally, previously disclosed I/O- and bandwidth capabilities may be inferred with respect to the PoP stacked-chip embodiments depicted and described in FIG. 4.

Figure 5:
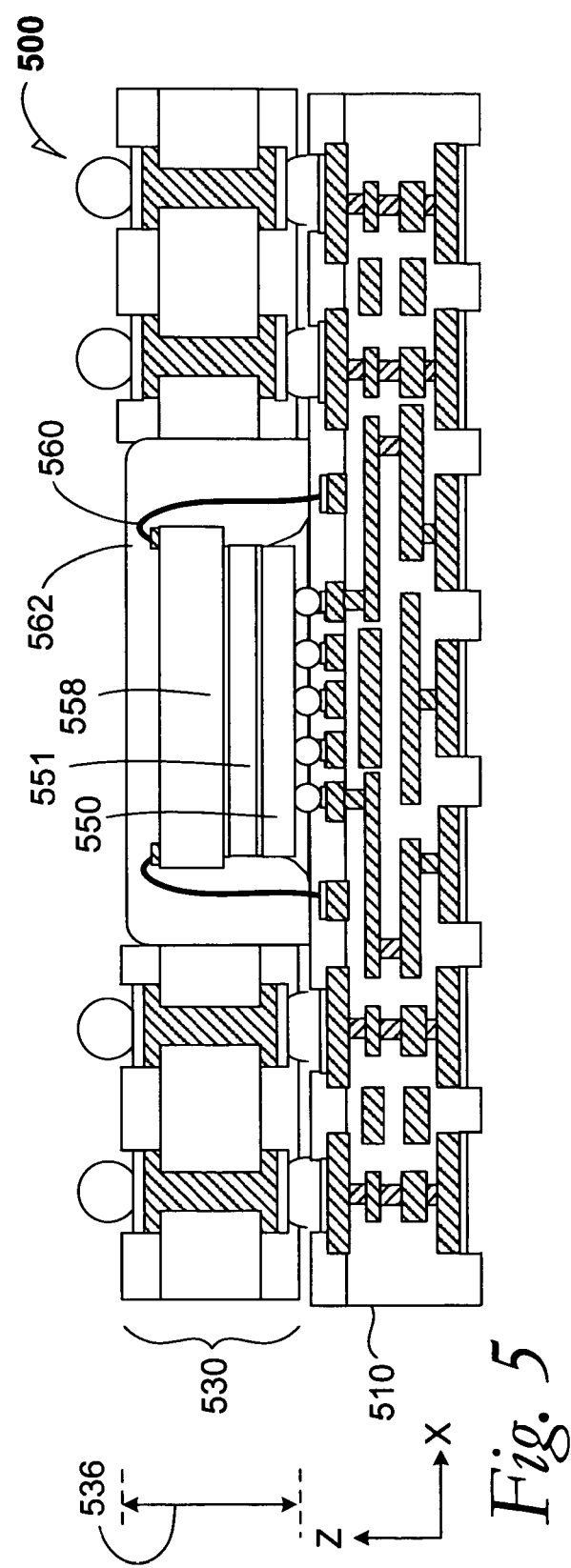
FIG. 5 is a cross-section elevation of a mixed-die apparatus that will support a package-on-package apparatus according to an embodiment.

FIG. 5 is a cross-section elevation of a mixed-die apparatus 500 that will support a package-on-package apparatus according to an embodiment. The mixed-die apparatus 500 includes a bottom chip 550, a top chip 558, and an intermediate chip 551. The top chip 558 and the intermediate chip 551 are supported by the bottom chip 550. The bottom chip 550 is a flip chip that may be referred to as a first chip, the intermediate chip 551 is a TSV-coupled chip that may be referred to as a second chip 551, and the top chip 558 is a wire-bonded chip that may be referred to as a subsequent chip 558. In an embodiment, the number of TSV-coupled chips disposed immediately above the bottom chip 550 is in a range from 2 to 8, followed by the top chip 556. Processing of the bottom chip 550 may be done by any embodiment disclosed with respect to the bottom chips depicted in this disclosure.

In an embodiment, the top chip 558 is coupled to the package substrate 510 by wire bonds, one of which is indicated by reference numeral 560. The offset height 536 of the interposer 530 therefore accommodates the height of the mixed-die stack that includes the wire bonds 560 as well as the top chip 558, the intermediate chip 551, the bottom chip 550, and the offset created by the electrical bumps and inter-chip adhesives and spacers as illustrated.

In a process embodiment, a stack encapsulation 562 has been filled to isolate the mixed-die stack and to further prevent the bond wires 560 from moving. The stack encapsulation 562 may be used also to protect the mixed-die stack from environmental and handling dangers. The stack encapsulation 562 may also be used to facilitate heat transfer away from the mixed-die stack. In an embodiment, no stack encapsulation is used.

In an embodiment, the first chip 550 is a processor, the intermediate chip 551 is a TSV RAM chip, and the top chip 558 is an RF device. The mixed-die stack may be used in a wireless communicator such as a smart phone.

Details illustrated and described with respect to previously disclosed embodiments may also be inferred by observing similar structures and spaces depicted in FIG. 5 where appropriate. Additionally, previously disclosed I/O- and bandwidth capabilities may be inferred with respect to the PoP stacked-chip embodiments depicted and described in FIG. 5.

Figure 6:
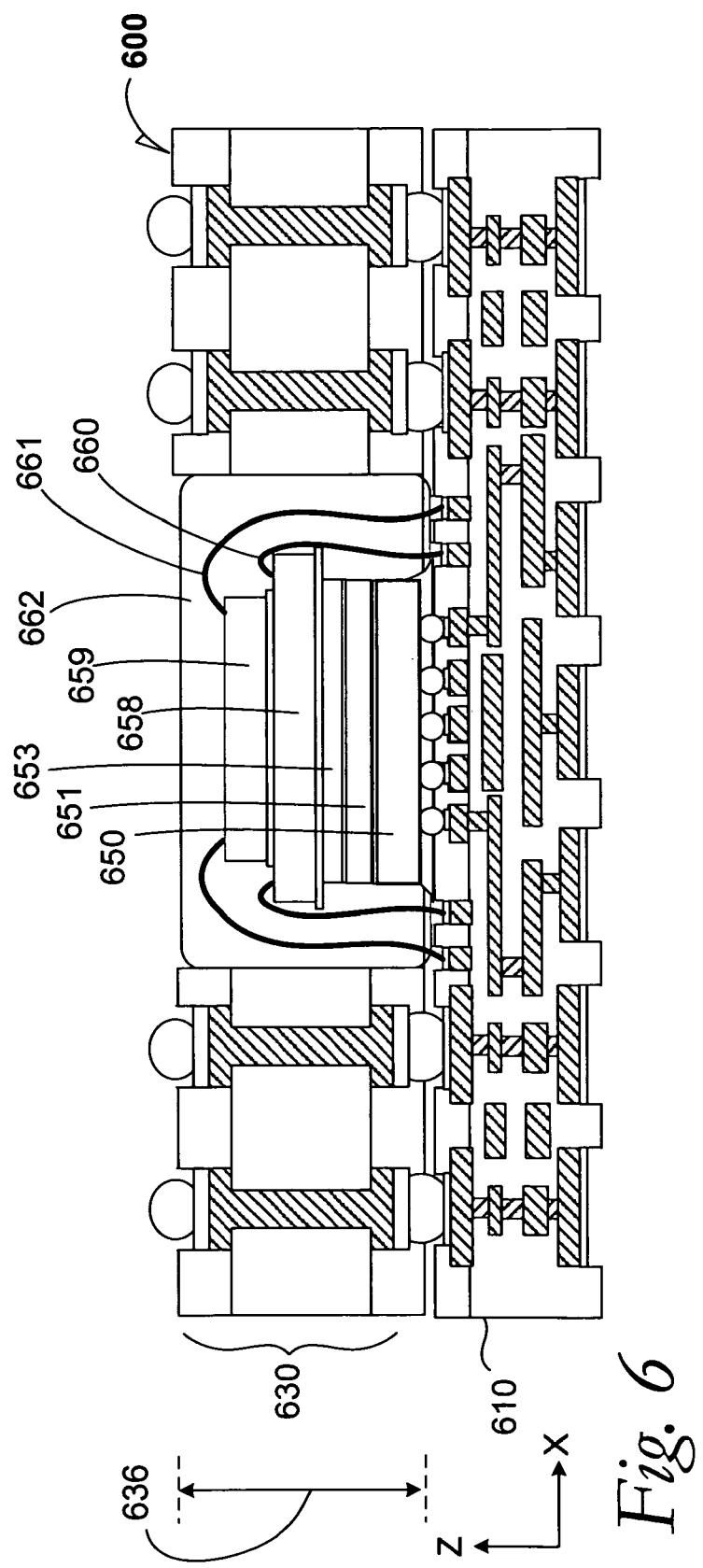
FIG. 6 is a cross-section elevation of a mixed-die apparatus that will support a package-on-package mixed-die apparatus according to an embodiment.

FIG. 6 is a cross-section elevation of a mixed-die apparatus 600 that will support a PoP mixed-die apparatus according to an embodiment. The mixed-die apparatus 600 includes a bottom chip 650, a top chip 659, and several intermediate chips 651, 653, and 658. The top chip 659 and the intermediate chips 651, 653, and 658 are supported by the bottom chip 650. Processing of the bottom chip 650 may be done by any embodiment disclosed with respect to the bottom chips depicted in this disclosure.

The mixed-die apparatus 600 is an embodiment with multiple TSV chips and multiple wire-bond chips. The bottom chip 650 is a flip chip that may be referred to as a first chip. The intermediate chip 651 is a TSV-coupled chip that may be referred to as a second chip 651. The intermediate chip 653 is a TSV-coupled chip that may be referred to as a third chip 653. The intermediate chip 658 is a wire-bonded chip that may be referred to as a fourth chip 658. And the top chip 659 is a wire-bonded chip that may be referred to as a subsequent chip 659. In an embodiment, the number of TSV-coupled chips disposed immediately above the bottom chip 550 and below the wire-bond chip 658 is in a range from 2 to 8.

In an embodiment, both the wire-bond chip 658 and the wire-bond chip 559 are coupled to the package substrate 610 by wire bonds 660 and 661, respectively. The offset height 636 of the interposer 630 therefore accommodates the height of the mixed-die stack that includes the wire bonds 660 and 661 as well the entire chip stack and electrical bumps and inter-chip adhesives and spacers as illustrated.

In a process embodiment, a stack encapsulation 662 has been filled to isolate the mixed-die stack and to further prevent the bond wires 660 and 661 from moving. The stack encapsulation 662 may be used also to protect the mixed-die stack from environmental and handling dangers. The stack encapsulation 662 may also be used to facilitate heat transfer away from the mixed-die stack. In an embodiment, no stack encapsulation is used.

Details illustrated and described with respect to previously disclosed embodiments may also be inferred by observing similar structures and spaces depicted in FIG. 6 where appropriate. Additionally, previously disclosed I/O- and bandwidth capabilities may be inferred with respect to the PoP stacked-chip embodiments depicted and described in FIG. 6.

Figure 7:
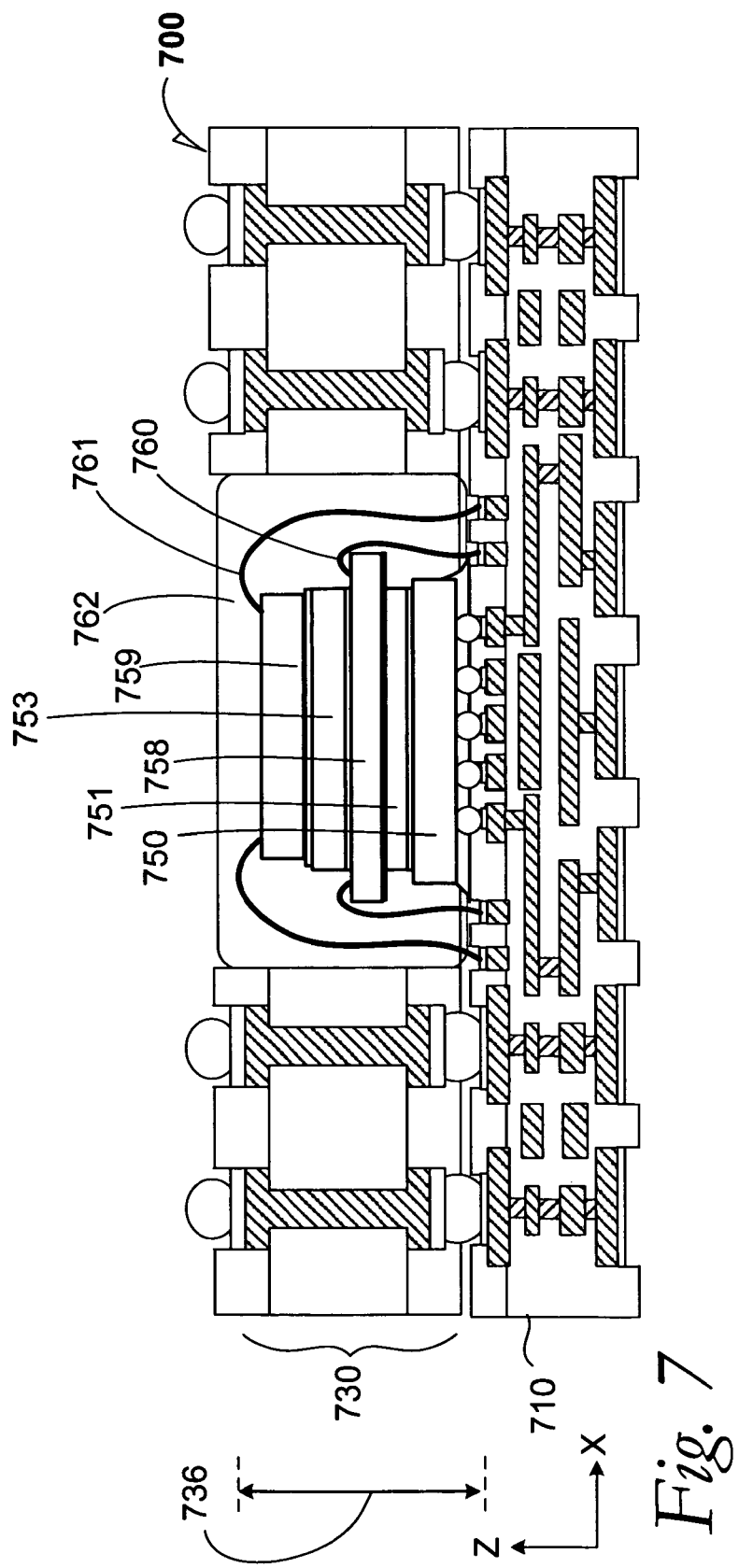
FIG. 7 is a cross-section elevation of a mixed-die apparatus that will support a package-on-package apparatus according to an embodiment.

FIG. 7 is a cross-section elevation of a mixed-die apparatus 700 that will support a package-on-package apparatus according to an embodiment. The mixed-die apparatus 700 includes a bottom chip 750, a top chip 759, and several intermediate chips 751, 753, and 758. The top chip 759 and the intermediate chips 751, 753, and 758 are supported by the bottom chip 750. The mixed-die apparatus 700 is an embodiment with multiple TSV chips and multiple wire-bond chips where a wire-bond chip is below a TSV chip.

The bottom chip 750 is a flip chip that may be referred to as a first chip. The intermediate chip 751 is a TSV-coupled chip that may be referred to as a second chip 751. The intermediate chip 758 is a wire-bonded chip that may be referred to as a third chip 758. The intermediate chip 753 is a TSV-coupled chip that may be referred to as a fourth chip 753. And the top chip 759 is a wire-bonded chip that may be referred to as a subsequent chip 759. In an embodiment, the second chip 751 is a memory cache chip that supports the bottom chip 750. Processing of the bottom chip 750 may be done by any embodiment disclosed with respect to the bottom chips depicted in this disclosure.

In an embodiment, the fourth chip 753 is a TSV memory cache chip the supports the subsequent chip 759. In an example embodiment, the mixed-die apparatus 700 is part of a PoP stacked-chip apparatus such as a super-smart phone. The bottom chip 750 in this embodiment is a processor and the second chip 751 is a memory cache. The intermediate chip 758 is a wire-bonded device for processing online communications. The top chip 759 is a global-positioning system (GPS) chip that is supported by the fourth chip 753, which acts as a cache for the GPS chip 759. Further in an example embodiment, a top package In an embodiment, the fourth chip 753 is used as a support and interface between the intermediate chip 758 and the top chip 759. For example, the fourth chip 753 has a TSV that allows direct communication between the top chip 759 and the intermediate chip 758.

In an embodiment, both the wire-bond chip 758 and the wire-bond chip 759 are coupled to the package substrate 710 by wire bonds 760 and 761, respectively. The offset height 736 of the interposer 730 therefore accommodates the height of the mixed-die stack that includes the wire bonds 760 and 761 as well the entire chip stack and electrical bumps and inter-chip adhesives and spacers as illustrated.

In a process embodiment, a stack encapsulation 762 has been filled to isolate the mixed-die stack and to further prevent the bond wires 760 and 761 from moving. The stack encapsulation 662 may be used also to protect the mixed-die stack from environmental and handling dangers. The stack encapsulation 762 may also be used to facilitate heat transfer away from the mixed-die stack. In an embodiment, no stack encapsulation is used.

Details illustrated and described with respect to previously disclosed embodiments may also be inferred by observing similar structures and spaces depicted in FIG. 6 where appropriate. Additionally, previously disclosed I/O- and bandwidth capabilities may be inferred with respect to the PoP stacked-chip embodiments depicted and described in FIG. 6.

Figure 8:
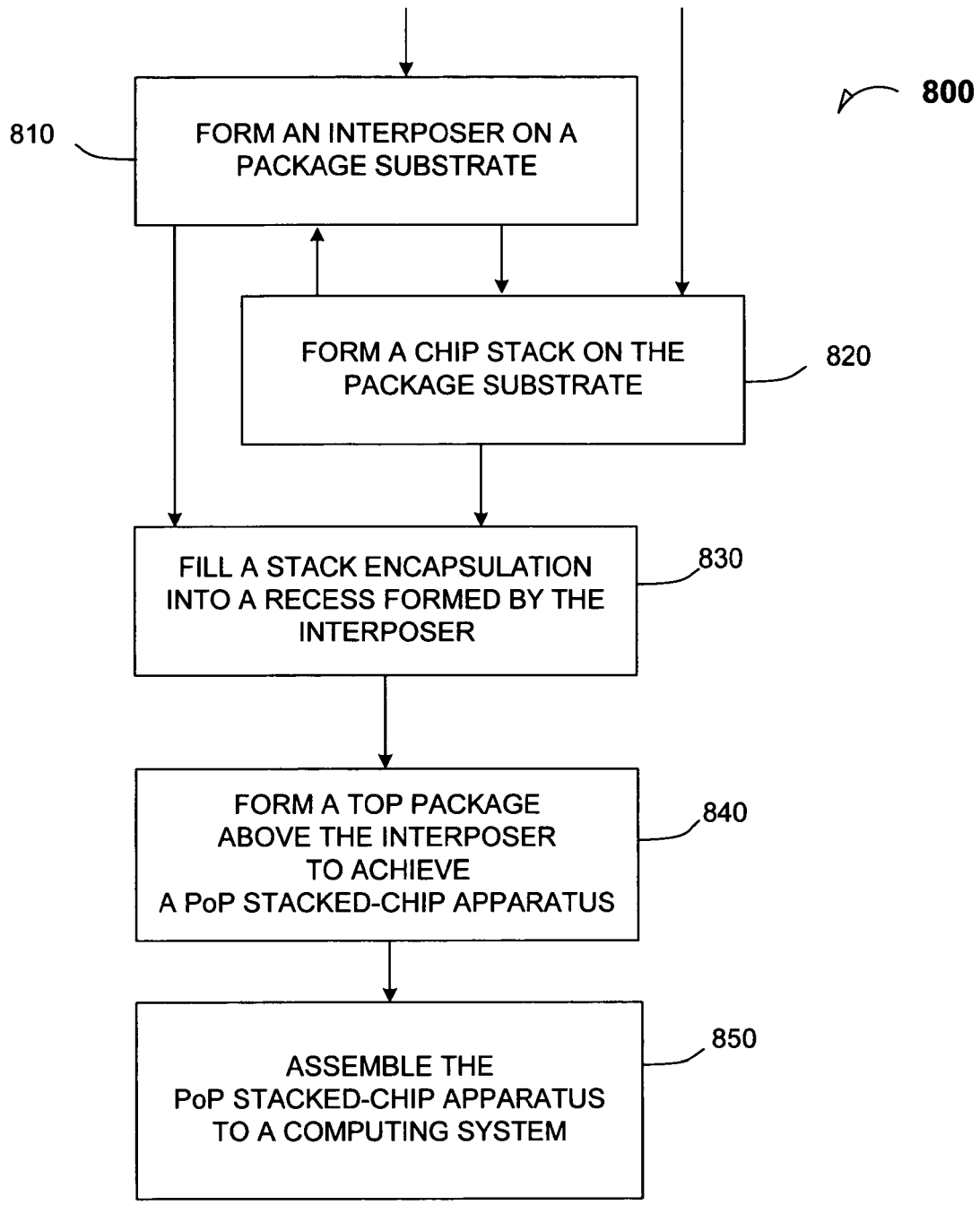
FIG. 8 is a process and method flow diagram according to an example embodiment.

FIG. 8 is a process and method flow diagram 800 according to an example embodiment.

At 810, a process includes forming an interposer on a package substrate. The interposer is configured to have an offset that will match a chip stack to be placed on the package substrate.

At 820, the process includes forming a chip stack on the package substrate. Where process 820 precedes process 810, the interposer is placed on the package substrate after forming the chip stack. Where process 820 follows process 810, the chip stack is formed within a recess left by the interposer. In an embodiment, the process commences at 810 and terminates at 820.

At 830, the process includes filling a stack encapsulation to isolate the chip stack. In an embodiment, the process commences at 810 and terminates at 830.

At 840 the process includes forming a top package on the interposer. In an embodiment, the process commences and terminates at 840.

Figure 9:
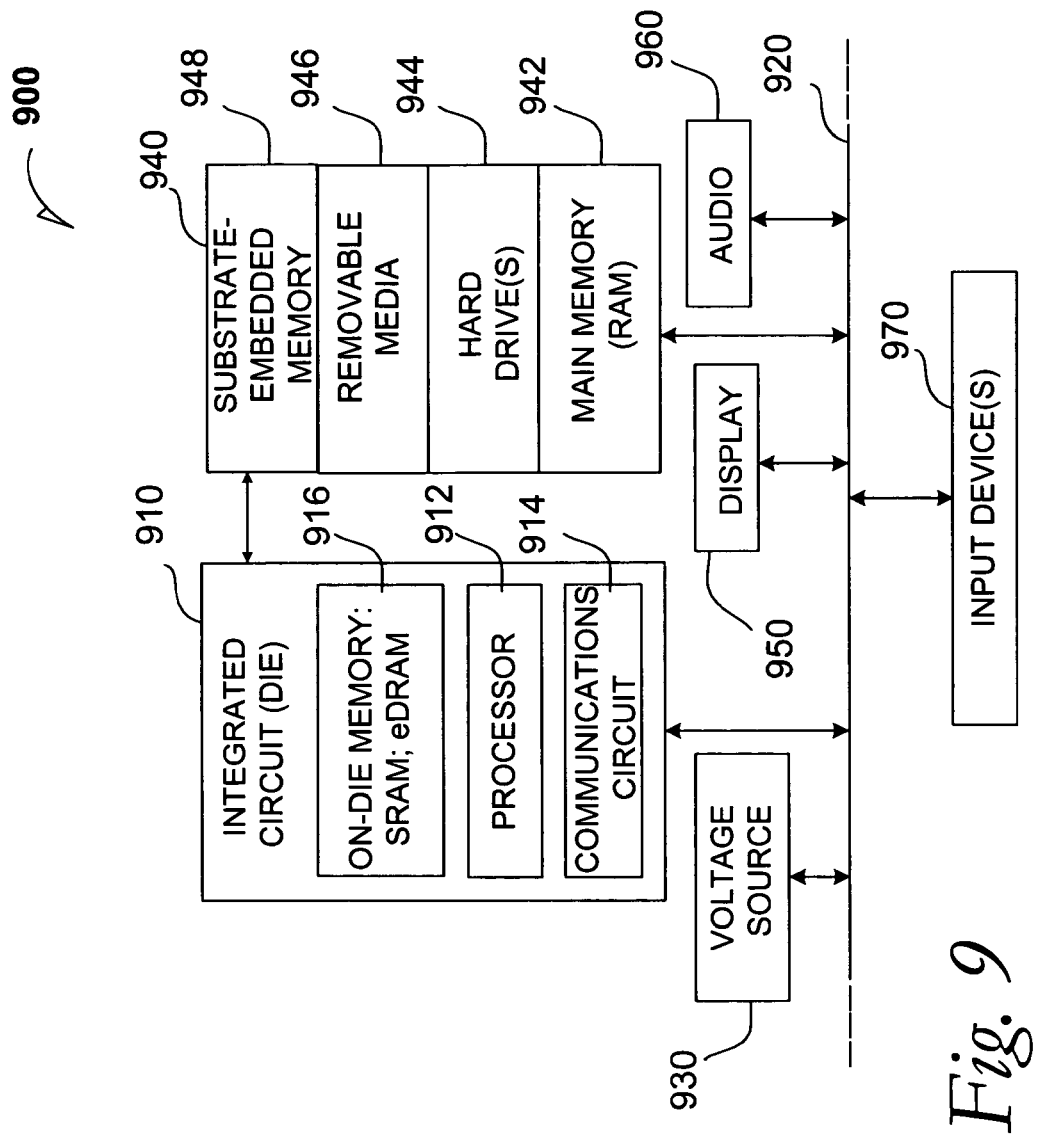
FIG. 9 is a schematic of a computer system according to an embodiment.

FIG. 9 is a schematic of a computer system 900 according to an embodiment. The computer system 900 (also referred to as the electronic system 900) as depicted can embody a PoP stacked-chip apparatus according to any of the several disclosed embodiments and their equivalents as set forth in this disclosure. In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, pagers, portable computers, two-way radios, and similar electronic systems. In an embodiment, the processor 910 includes on-die memory 916 such as static random-access memory (SRAM) and the SRAM may include a 6T SRAM cell with independent S/D sections of the access and pull-down regions. In an embodiment, the processor 910 includes embedded on-die memory 916 such as embedded dynamic random-access memory (eDRAM).

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the microelectronic die embedded in a processor mounting substrate according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900.

As shown herein, the integrated circuit 910 can be implemented in a number of different embodiments, including a PoP stacked-chip apparatus according to any of the several disclosed embodiments and their equivalents, an electronic system, a computer system, one or more methods of fabricating an integrated circuit, and one or more methods of fabricating an electronic assembly that includes a PoP stacked-chip apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed PoP stacked-chip apparatus embodiments and their equivalents.

The Abstract is provided to comply with 37 C.F.R. § 1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A package-on-package stacked-chip apparatus comprising:
   a package substrate including a die side and a land side;
   a chip stack disposed on the die side, wherein the chip stack includes a bottom chip disposed on the die side, a top chip disposed above the bottom chip, and an intermediate chip positioned between the bottom chip and the top chip, wherein the bottom chip is a flip chip bonded to the package substrate through a chip ball array, the bottom chip including through-silicon vias extending therethrough, the intermediate chip including through-silicon vias extending therethrough, wherein the top chip is electrically coupled to the package substrate using the through-silicon vias of the intermediate chip, and wherein the chip stack has an offset height;
   an interposer disposed on the die side, the interposer including an opening extending therethrough, the chip stack positioned-on the package substrate within the opening, the interposer surrounding the chip stack, wherein the interposer accommodates the offset height of the chip stack;
   a top package disposed on the interposer, wherein the top package includes at least one microelectronic device
   an encapsulant between the chip stack and the interposer
   an underfill material between the package substrate and the bottom chip, wherein the encapsulant is also between the underfill material and the interposer; and
   a fill material on the die side between the package substrate and the interposer, the fill material including an inner surface adjacent to the encapsulant.

2. The apparatus of claim 1, wherein the chip stack includes at least one additional intermediate chip positioned between the bottom chip and the top chip.

3. The apparatus of claim 1, wherein the chip stack includes a plurality of additional intermediate chips positioned between the bottom chip and the top chip.

4. A computing system comprising the apparatus of claim 1.

5. An apparatus comprising:
   a substrate including a die side and a land side;
   a chip stack disposed on the die side, the chip stack including a bottom chip disposed on the die side and a top chip disposed above the bottom chip, the bottom chip comprising a flip chip bonded to the substrate through a chip ball array, the bottom chip including through-silicon vias extending therethrough, wherein the top chip is electrically coupled to the substrate using the through-silicon vias of the bottom chip, and wherein the chip stack has an offset height;
   an interposer disposed on the die side, the interposer including an opening extending therethrough, the chip stack positioned on the substrate within the opening, the interposer surrounding the chip stack, wherein the interposer accommodates the offset height of the chip stack;
   an encapsulant between the chip stack and the interposer;
   an underfill material between the substrate and the bottom chip, wherein the encapsulant is also between the underfill material and the interposer;
   a fill material on the die side between the substrate and the interposer, the fill material including an inner surface adjacent to the encapsulant.

6. The apparatus of claim 5, wherein the chip stack includes at least one intermediate chip positioned between the bottom chip and the top chip.

7. The apparatus of claim 5, wherein the chip stack includes a number of intermediate chips between the bottom chip and the top chip, the intermediate chips each including through-silicon vias extending therethrough, wherein the number of intermediate chips is in the range of from 2 to 7 intermediate chips.

8. The apparatus of claim 5, wherein the top chip comprises a device selected from the group consisting of a memory device and a radio frequency device.

9. The apparatus of claim 5, wherein the top chip includes a width that is greater than that of the bottom chip.

10. The apparatus of claim 5, wherein the top chip has a thickness that is less than that of the bottom chip.

11. A computing system comprising the apparatus of claim 5.

12. An apparatus comprising:
   a substrate;
   a chip stack including a plurality of chips disposed on the substrate, including a first chip and a second chip, wherein the first chip is a flip chip mounted on the substrate, wherein the first chip is positioned between the substrate and the second chip, wherein the first chip includes through-silicon vias extending therethrough, wherein the second chip is electrically coupled to the substrate using the through-silicon vias of the first chip, and wherein the chip stack has an offset height;
   an interposer disposed on the substrate, the interposer including an opening extending therethrough, the chip stack positioned on the substrate within the opening, the interposer surrounding the chip stack, wherein the interposer accommodates the offset height of the chip stack;
   an encapsulant positioned between the chip stack and the interposer in the opening;
   an underfill material positioned between the substrate and the first chip, wherein the encapsulant is also positioned between the underfill material and the interposer; and
   a fill material positioned between the substrate and the interposer, the fill material including an inner surface adjacent to the encapsulant.

13. The apparatus of claim 12, wherein the chip stack includes a third chip positioned between the first chip and the second chip, wherein the third chip includes through-silicon vias.

14. A computing system comprising the apparatus of claim 12.

* * * * *